United States Patent [19]

Saito et al.

[11] Patent Number: 4,894,349
[45] Date of Patent: Jan. 16, 1990

[54] TWO STEP VAPOR-PHASE EPITAXIAL GROWTH PROCESS FOR CONTROL OF AUTODOPING

[75] Inventors: Yoshihiko Saito, Yokosuka; Yoshiaki Matsushita, Yokohama, both of Japan

[73] Assignee: Kabushiki Kaisha Toshiba, Kawasaki, Japan

[21] Appl. No.: 284,512

[22] Filed: Dec. 15, 1988

[30] Foreign Application Priority Data

Dec. 18, 1987 [JP] Japan .................. 62-320431

[51] Int. Cl.$^4$ ........................................ H01L 21/20
[52] U.S. Cl. .............................. 437/95; 148/DIG. 7; 148/DIG. 25; 148/DIG. 169; 156/693; 437/81; 437/111; 437/112
[58] Field of Search .................... 148/DIG. 7, 15, 17, 148/25, 57, 97, 130, 169; 156/610–615; 427/248.1, 252, 253; 437/26, 81, 95, 97, 108, 111, 112, 939, 946, 949

[56] References Cited

U.S. PATENT DOCUMENTS

| | | | |
|---|---|---|---|
| 3,189,494 | 6/1965 | Short | 437/95 |
| 3,660,180 | 5/1972 | Wajda | 437/95 |
| 3,669,769 | 6/1972 | Badami et al. | 437/95 |
| 3,716,422 | 2/1973 | Ing et al. | 437/95 |
| 3,765,960 | 10/1973 | Boss et al. | 437/95 |
| 3,847,686 | 11/1974 | Stein | 437/95 |
| 3,853,974 | 12/1974 | Reuschel et al. | 437/81 |
| 3,885,061 | 5/1975 | Corboy et al. | 437/95 |
| 3,941,647 | 3/1976 | Druminski | 156/612 |
| 3,956,037 | 5/1976 | Ishii et al. | 437/95 |
| 4,497,683 | 2/1985 | Celler et al. | 156/613 |
| 4,504,330 | 3/1985 | Gaind et al. | 437/95 |
| 4,579,609 | 4/1986 | Reif et al. | 437/103 |

FOREIGN PATENT DOCUMENTS

| | | | |
|---|---|---|---|
| 0061273 | 6/1978 | Japan | 437/95 |
| 0135571 | 11/1978 | Japan | 437/95 |

OTHER PUBLICATIONS

Bratter et al., "Epitaxial Deposition Process", IBM TDB, vol. 15, No. 2, Jul. 1972, p. 684.
Ishii et al., "Silicon Epitaxial . . . by Two-Step Epitaxial Growth Technique", J. Electrochem. Soc., vol. 122, No. 11, Nov. 1975, pp. 1523–1531.
Aoyama et al., "Gas Phase Reactions and Transport in Silicon Epitaxy", J. Electrochem. Soc., vol. 130, No. 1, Jan. 1983, pp. 203–207.

Primary Examiner—Brian E. Hearn
Assistant Examiner—William Bunch
Attorney, Agent, or Firm—Finnegan, Henderson, Farabow, Garrett and Dunner

[57] ABSTRACT

A process for forming a vapor-phase epitaxial growth layer on a silicon wafer having a buried layer of a high As or B concentration. This vapor-phase epitaxial growth process is performed in two steps of (i) performing a vapor-phase epitaxial growth at a relatively low temperature by using a reaction gas containing at least one kind selected from a group consisting of $SiH_xF_{4-x}$ (x=0 to 3) and $Si_2H_xF_{6-x}$ (x=0—5) and at least one kind selected from a group consisting of $SiH_4$ and $Si_2H_6$, and (ii) performing a vapor-phase epitaxial growth under a condition which allows a higher growth rate that in the step (i) by using a reaction gas containing $SiH_4$ or $Si_2H_6$ which may or may not be accompanied with silane fluoride.

10 Claims, 3 Drawing Sheets

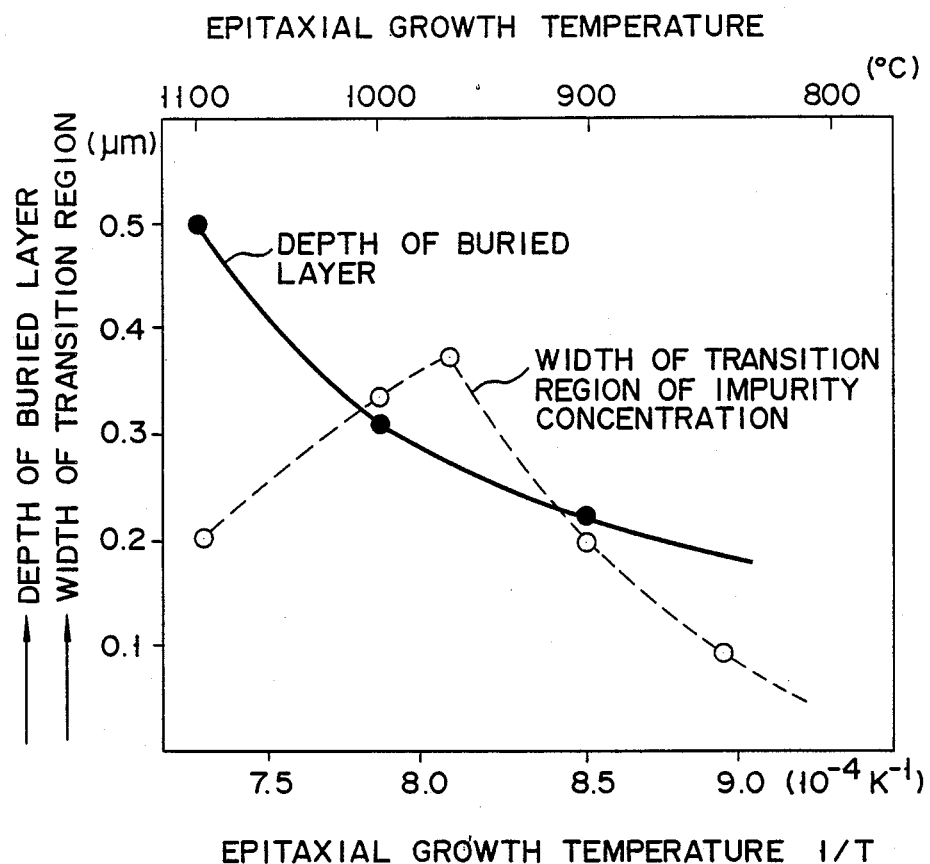
F I G. 3

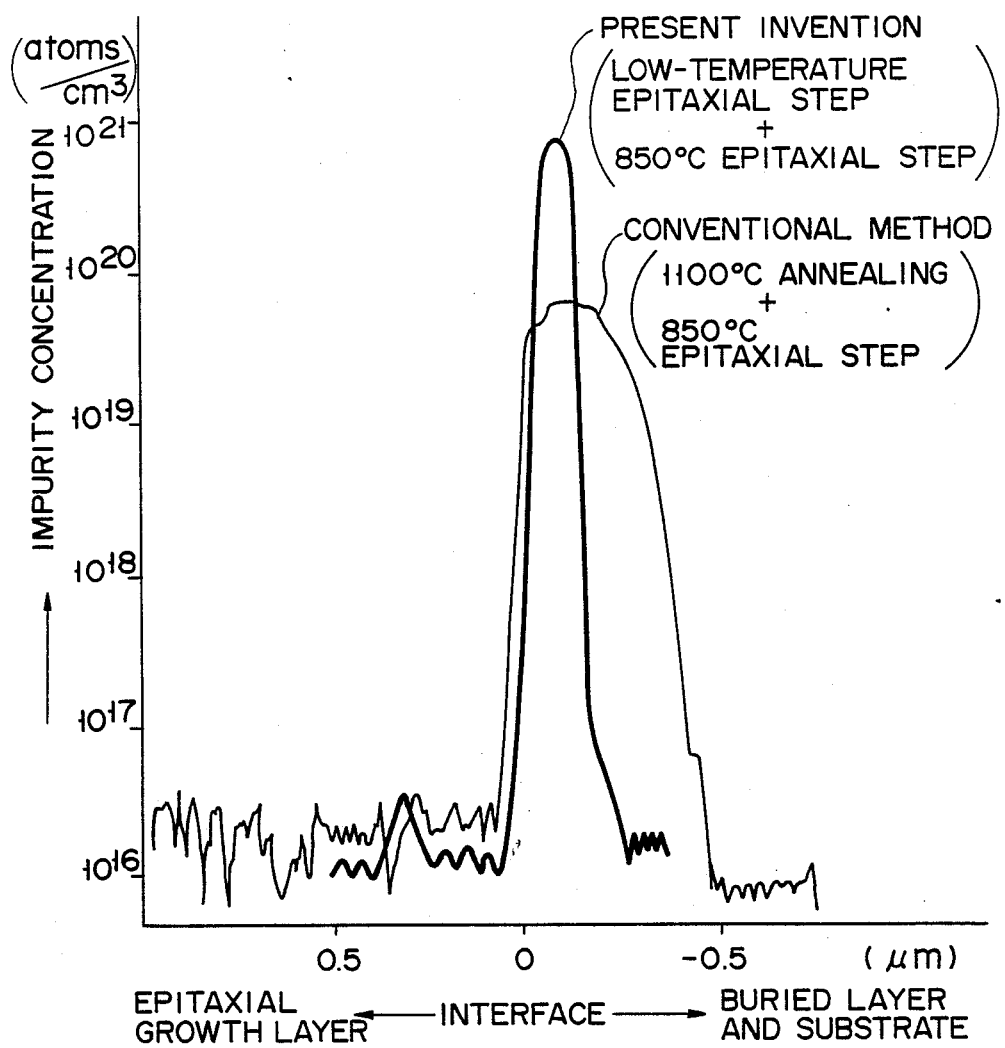
F I G. 4

TWO STEP VAPOR-PHASE EPITAXIAL GROWTH PROCESS FOR CONTROL OF AUTODOPING

BACKGROUND OF THE INVENTION

1. Field of the Invention

The present invention relates to a vapor-phase epitaxial growth process performed on a silicon wafer having a buried layer of a high impurity concentration.

2. Description of the Related Art

Precise control of an impurity dopant in a semiconductor substrate and a high concentration of the impurity dopant are essential for obtaining high-performance, high-speed bipolar integrated circuits (ICs) and Bi-CMOS ICs. Also, for reducing parasitic capacity, reduction in size of elements, for example, by trench isolation, has been proposed.

A silicon wafer for high-speed bipolar ICs or BI-CMOS ICs includes a high concentration impurity buried layer. For example, antimony (Sb) is conventionally used as a dopant for an N+ buried layer.

When Sb is used as a dopant, however, the following problems occur:

(a) The solid solubility of Sb in silicon is $-5 \times 10^{19}/cm^3$ at 1200° C., which is lower than $10^{21}/cm^3$ of arsenic (As). Thus, the obtaining of a buried layer of high impurity concentration is restricted.

(b) The atomic radius of Si is 1.17 Å, that of Sb is 1.36 Å, and that of As is 1.17 Å. When Sb is doped in a silicon wafer at high concentration, mismatch of atomic radius occurs, resulting in distortion of an epitaxial growth film.

Under the circumstance, it is proposed to use an As or B ion-implanted substrate formed by implanting As ions or B ions in a buried layer which has an atomic radium matching with a silicon wafer so that the concentration of doping can be increased. However, when an epitaxial growth is performed on the As or B ion-implanted substrate, a problem of auto-doping from the buried layer occurs. In order to suppress the auto-doping, the following methods are available, though they have problems:

(a) Reduced pressure epitaxy growth method: An epitaxial growth is performed in reduced pressure at a temperature of 1050° C. or above. Since a high-temperature step is performed, the depth xj of the embedded layer is undesirably increased, and the As dopant is evaporated and the concentration of impurity in the buried layer is lowered.

(b) A photo-epitaxial growth method: With this method, all steps are performed at low temperature. This method is still in an experimental stage, and has not yet been put into practice. This method has a problem of productivity rate.

(c) A two-stage epitaxial growth method. In a first epitaxial growth process, a non-doped epitaxial film is made to grow, and in a second epitaxial growth process, a doped epitaxial film of desired impurity concentration is made to grow. However, due to a particular reaction gas to be used, a high-temperature process must be performed. Thus, the depth xj of the buried layer is increased, and the dopant (As) is evaporated, resulting in a decrease in concentration of the buried layer.

SUMMARY OF THE INVENTION

The object of the present invention is to solve the above-mentioned problems in performing a vapor-phase epitaxial growth on a silicon wafer having a buried layer of a high As or B concentration, that if the auto-doping from the buried layer is to be suppressed, the depth xj of the buried layer is increased, and the dopant is evaporated to lower the concentration of the buried layer, resulting in a low productivity rate.

Namely, the object of this invention is to provide a vapor-phase epitaxial growth process wherein the variations in depth xj of the high-concentration buried layer and in concentration of the dopant can be remarkably suppressed, and an epitaxial growth layer can be manufactured at high productivity rate with the auto-doping being suppressed.

In order to achieve the object of the invention, the present invention provides a vapor-phase epitaxial growth process comprising:

(i) a step of performing a gas-phase epitaxial growth at a temperature of 600° C. to 900° C. by using a reaction gas containing at least one kind selected from a group consisting of $SiH_xF_{4-x}$ (x=0 to 3) and $Si_2H_xF_{6-x}$ (x=0.5), and at least one kind selected from a group consisting of $SiH_4$ and $Si_2H_6$, thereby to form a first epitaxial layer on a silicon wafer having a high impurity concentration buried layer containing arsenic (As) or boron (B) as a dopant; and (ii) a step of performing a gas-phase epitaxial growth at a growth rate higher than that performed in step (i) by using a reaction gas containing at least one kine of silane selected from a group consisting of $SiH_4$ and $Si_2H_6$, or a reaction gas containing at least one kind of the silane and at least one kind of silane fluoride selected from a group consisting of $SiH_xF_{4-x}$ (x=0 to 3) and $Si_2H_xF_{6-x}$ (x=0−5), thereby forming a second epitaxlal layer on said first epitaxial layer.

The temperature employed in step (i) is, preferably, between 600° C. to 800° C. Step (i) may be performed while the temperature of the silicon wafer is rising, or is kept constant. However, from the viewpoint of the productivity rate, it is desirable that step (i) be performed while the temperature of the silicon wafer is rising. The pressure employed in step (i) be, preferably, not higher than 100 torr. If step (i) is performed under pressure of 100 torr or below, the growth can easily be performed at low temperature. When an epitaxial growth is to be performed on a wafer of large-diameter, the low-temperature processing is advantageous to prevent the slip in crystal structure. The silicon wafer may be of a twin tub structure consisting of a high boron concentration buried layer and a high concentration arsenic concentration buried layer. The thickness of the first epitaxial layer may be 0.3 μm or less. From the viewpoint of productivity rate, the thickness of the first epitaxial layer should preferably be 0.05 μm or less. The mixing ratio of the silane fluoride to the silane of the reaction gas used in step (i) is optimally 5–30:1, in order to grow a high quality singlecrystal. In step (ii) however, in view of productivity, the temperature should be kept, at a relatively high temperature for example, 850° C., so that the epitaxial growth proceeds at a growth rate of 0.05 μm/min or more, preferably, 0.1 μm/min or more.

According to the present invention, as stated above, in the first epitaxial step, the reaction gas employed therein is highly effective in allowing the epitaxial layer to grow at a low temperature. Thus, the impurity concentration distribution in the depth direction, and the concentration of the dopant can be precisely controlled. In the second epitaxial growth process, the epitaxial layer can be formed at high productivity rate. Therefore, variation in depth xj of the high impurity concentration buried layer and in concentration of the dopant can be remarkably suppressed, and the epitaxial layer wherein auto-doping is prevented can be manufactured at high productivity rate.

BRIEF DESCRIPTION OF THE DRAWINGS

FIG. 3 is a graph showing the depth of the buried layer and the width of a transition region in relation to growth temperature, in the vapor-phase epitaxial growth process; and FIG. 4 is a graph showing the impurity concentration distribution in the depth direction of a silicon wafer formed by the example of the process of the present invention, as compared to that obtainable with a conventional process.

DESCRIPTION OF THE PREFERRED EXAMPLE

An example of the present invention will now be described with reference to the accompanying drawings.

Figure 1:
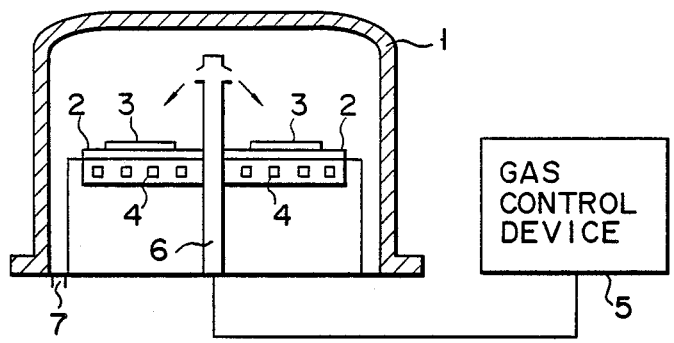
FIG. 1 shows an example of an epitaxial growth apparatus used in a gas-phase epitaxial growth method of the present invention.

FIG. 1 schematically shows a vertical-type reaction apparatus as an example of vapor-phase epitaxial growth apparatus used in a process of the present invention. Bell-jar 1 is made of quartz. Rotatable susceptor 2 is arranged within bell-jar 1. Silicon wafer 2 is placed on susceptor 1. Heating coil 4 heats wafer 3. A reaction gas is supplied from external gas control device 5 to gas pipe 6. The gas is discharged through a nozzle of gas pipe 6 to the upper inner region of bell-jar 1. Gas outlet 7 is provided at the bottom of bell-jar 1. Heating coil 4 heats wafer 3 by high-frequency heating method. However, wafer 3 can be heated by any other heating method, as long as the temperature of wafer 3 can be desirably controlled. Also, the reaction apparatus is not limited to the above-mentioned vertical-type furnace.

Figure 2:
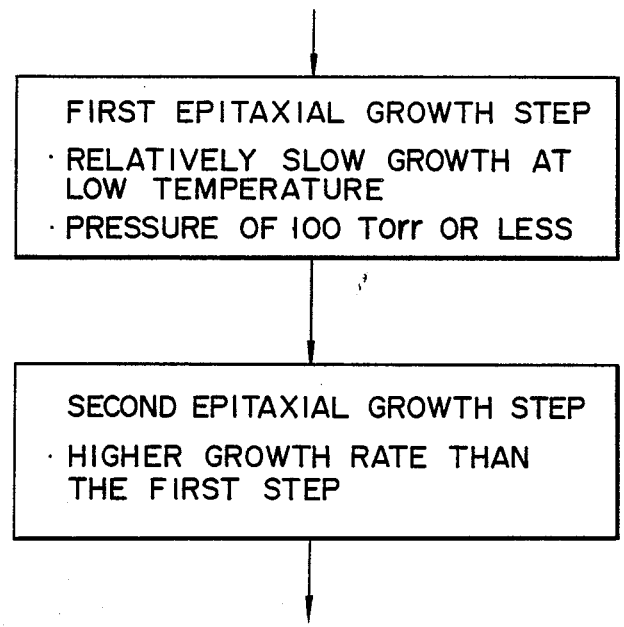
FIG. 2 is a flowchart showing the steps of a process according to an example of the present invention.

An example of a vapor-phase epitaxial growth process for performing a vapor-phase epitaxial growth on wafer 3 having a highly doped As layer will now be described with reference to FIG. 2. In a first epitaxial growth step, for example, a raw feed gas containing a mixture of $SiH_2F_2$ (silane difluoride) gas and $Si_2H_6$ (disilane) gas, the ratio thereof being, e.g., 10:1, and a carrier gas (e.g., $H_2$ gas) are supplied to bell-jar 1. The raw feed gas is heated at a temperature ranging 600° C. to 900° C. under a pressure of 100 torr or below, thus forming a first epitaxial layer having a thickness of up to 0.3 μm. In a second epitaxial growth step to form a second epitaxial layer, $Si_2H_6$ is employed as a raw feed gas. The gas is heated to a fixed temperature of, e.g., 850° C. and the epitaxial growth process is performed at a suitable growth rate (e.g., 0.1 μm/min or above). This growth rate may be suitably selected by taking into consideration a productivity rate.

Doping can be performed in either of the first epitaxial growth step or the second epitaxial growth step. In addition, the process of the present invention can be used in the case where a slight amount of halogenated silane such as chloride coexists with silane fluoride.

In the above process, the first epitaxial step employs the specific reaction gas which allows the first epitaxial layer to grow at a relatively low temperature. Thus, as compared to a conventional method employing a high-temperature step, the impurity concentration distribution in the depth direction of the buried layer can be precisely controlled, and the variations in depth xj of the buried layer and in As concentration can be suppressed. Furthermore, in the second epitaxial growth step, the growth of the second epitaxial layer is performed at a growth rate higher than that of the first epitaxial growth step. Thus, the productivity rate can be increased, and all steps of the process can be completed within an hour.

FIG. 3 shows data indicating the relationship between the epitaxial growth temperature, on one hand, and the depth xj of the buried layer and the width of the transition region of the impurity concentration, on the other hand. It is understood that, when growth temperature T is low, the depth xj is small and the width of the transition region is also small.

In FIG. 4, a thick line indicates the data of the impurity concentration distribution in the depth direction of the substrate formed of the silicon wafer according to the process of the present invention. For the purpose of comparison, a thin line indicates the data of an impurity concentration distribution in the case of a conventional process (in which a silicon wafer is subjected to an annealing step at 1100° C. and, thereafter, an epitaxial growth is performed at 850° C.). It is understood that, according to the example of the present invention, the depth xj of the high-concentration As-buried layer does not considerably increase, and the impurity concentration distribution in the depth direction is exactly controlled.

Suppose that, in order to form a high impurity concentration buried layer, a dose of As ions amounting to $5 \times 10^{15} cm^{-2}$ is injected at an acceleration voltage of 50 keV, and an epitaxial process through annealing. In this case, if a heating process is performed at a temperature of 900° C. or below, as in the example of the present invention, the peak value of the As concentration is $10^{21}/cm^3$. On the other hand, if the heating step is performed at a temperature of 1100° C. or above, as in the conventional method, the peak value of the As concentration is $6 \times 10^{19} cm^3$. Thus, the peak value of the As concentration in the example according to the present invention is higher than that in the conventional method. Consequently, according to the present invention, a drive-in step after ion implantation is not necessary.

In the above example, the reaction gas used in the first epitaxial growth step was the mixture gas containing silane difluoride and disilane. However, the same advantages as were obtained in the above example can be brought about with the use of a mixture gas which is different from that of above example, i.e., a mixture of other silane fluoride and/or disilane fluoride with silane and/or disilane. In the second epitaxial growth step, disilane gas was used. However, the same advantages as were obtained in the above example can be obtained with the use of monosilane or a mixture of monosilane and disilane, or a mixture gas of these silanes and at least one of compounds selected from silane fluoride and disilane fluoride.

What is claimed is:

1. A vapor-phase epitaxial growth process comprising:
    (i) a step of performing a vapor-phase epitaxial growth at a temperature of 600° C. to 900° C. by using a reaction gas prepared by mixing at least one kind selected from a group consisting of $SiH_xF_{4-x}$ (x=0 to 3) and $Si_2H_xF_{6-x}$ (x=0-5), and at least one kind selected from a group consisting of $SiH_4$ and $Si_2H_6$ thereby to form a first epitaxial layer on a silicon wafer having a high impurity concentration buried layer containing arsenic (As) or boron (B) as a dopant; and (ii) a step of performing a vapor-phase epitaxial growth at a growth rate higher than that performed in step (i) by using a reaction gas a group consisting of $SiH_4$ and $Si_2H_6$, or a reaction gas containing at least one kind of the silane and at least one kind of silane fluoride selected from a group consisting of $SiH_xF_{4-x}$ (x=0 to 3) and $Si_2H_xF_{6-x}$ (x=0-5), thereby forming a second epitaxial layer on said first epitaxial layer.

2. A vapor-phase epitaxial growth process according to claim 1, wherein the step (i) is performed at a temperature of 600° C. to 800° C.

3. A vapor-phase epitaxial growth process according to claim 1, wherein the step (i) is performed while the temperature of the silicon wafer is rising.

4. A vapor-phase epitaxial growth process according to claim 1, wherein the step (i) is performed at a fixed temperature.

5. A vapor-phase epitaxial growth process according to claim 1, wherein the step (i) is performed under a pressure of 100 torr or below.

6. A vapor-phase epitaxial growth process according to claim 1, wherein the first epitaxial layer formed in the step (i) has a thickness of 0.3 μm or less.

7. A vapor-phase epitaxial growth process according to claim 1, wherein the first epitaxial layer formed in the step (i) has a thickness of 0.05 μm or less.

8. A vapor-phase epitaxial growth process according to claim 1, wherein the second epitaxial layer is formed in the step (ii) at a growth rate of 0.05 μm/min. or above.

9. A vapor-phase epitaxial growth process according to claim 1, wherein the mixture ratio of the silane fluoride and the silane in the reaction gas used in the step (i) is 5-30:1.

10. A vapor-phase epitaxial growth process according to claim 1, wherein said silicon wafer is of a twin tub structure consisting of a high boron concentration buried layer and a high arsenic concentration buried layer.

* * * * *